(12) United States Patent
Theiler

(10) Patent No.: US 8,212,391 B2
(45) Date of Patent: Jul. 3, 2012

(54) CIRCUIT ARRAY

(75) Inventor: Helmut Theiler, Lieboch (AT)

(73) Assignee: Austriamicrosystems AG, Unterpremstaetten (AT)

( * ) Notice: Subject to any disclaimer, the term of this patent is extended or adjusted under 35 U.S.C. 154(b) by 1404 days.

(21) Appl. No.: 10/521,931

(22) PCT Filed: May 21, 2003

(86) PCT No.: PCT/EP03/05328
§ 371 (c)(1),
(2), (4) Date: Jul. 19, 2005

(87) PCT Pub. No.: WO2004/015865
PCT Pub. Date: Feb. 19, 2004

(65) Prior Publication Data
US 2006/0012928 A1 Jan. 19, 2006

(30) Foreign Application Priority Data

Jul. 25, 2002 (DE) .................................. 102 33 876

(51) Int. Cl.
*H02J 3/00* (2006.01)
(52) U.S. Cl. ............................................. 307/38; 307/39
(58) Field of Classification Search .................... 307/38, 307/39
See application file for complete search history.

(56) References Cited

U.S. PATENT DOCUMENTS

| | | | | |
|---|---|---|---|---|
| 4,205,782 A | | 6/1980 | Cannella | |
| 4,300,032 A | * | 11/1981 | Niu et al. | 219/716 |
| 4,322,632 A | * | 3/1982 | Hart et al. | 307/41 |
| 4,465,956 A | * | 8/1984 | Fowler | 318/268 |
| 4,560,909 A | * | 12/1985 | Peil | 315/291 |
| 4,668,908 A | | 5/1987 | Aoki et al. | |
| 4,716,409 A | * | 12/1987 | Hart et al. | 340/825.22 |
| 4,719,446 A | * | 1/1988 | Hart | 340/310.11 |
| 4,777,379 A | | 10/1988 | Young | |
| 4,777,380 A | * | 10/1988 | Wathelet | 307/41 |
| 4,818,920 A | * | 4/1989 | Jacob | 318/16 |
| 4,896,083 A | * | 1/1990 | Kopala et al. | 318/268 |
| 4,990,908 A | * | 2/1991 | Tung | 340/825.63 |
| 4,992,709 A | * | 2/1991 | Griffin | 318/249 |
| 5,041,825 A | * | 8/1991 | Hart et al. | 340/3.4 |

(Continued)

FOREIGN PATENT DOCUMENTS

DE 38 13 538 11/1989

(Continued)

OTHER PUBLICATIONS

English Translation of International Preliminary Examination Report for application PCT/EP2003/005328.

*Primary Examiner* — Adi Amrany
(74) *Attorney, Agent, or Firm* — Fish & Richardson P.C.

(57) ABSTRACT

A circuit array controls operation of two loads that operate with a rectified AC voltage. The circuit array includes a semiconductor switch on a circuit path with the two loads and a control unit to generate a switch control signal that controls the semiconductor switch. The control unit includes a phase detection device to detect whether a phase of the AC voltage is positive or negative, and to output a detection signal that is based on whether the phase is positive or negative, and a logic unit to generate the switch control signal based on load control signals and the detection signal.

15 Claims, 2 Drawing Sheets

U.S. PATENT DOCUMENTS

| | | | |
|---|---|---|---|
| 5,365,154 A * | 11/1994 | Schneider et al. | 318/103 |
| 5,504,400 A * | 4/1996 | Dalnodar | 315/291 |
| 5,541,584 A * | 7/1996 | Mehta et al. | 340/825.57 |
| 5,614,811 A * | 3/1997 | Sagalovich et al. | 323/207 |
| 6,577,517 B2 * | 6/2003 | Jain et al. | 363/89 |

FOREIGN PATENT DOCUMENTS

| | | |
|---|---|---|
| EP | 0 117 198 | 2/1984 |
| EP | 0 515 961 | 5/1992 |

\* cited by examiner

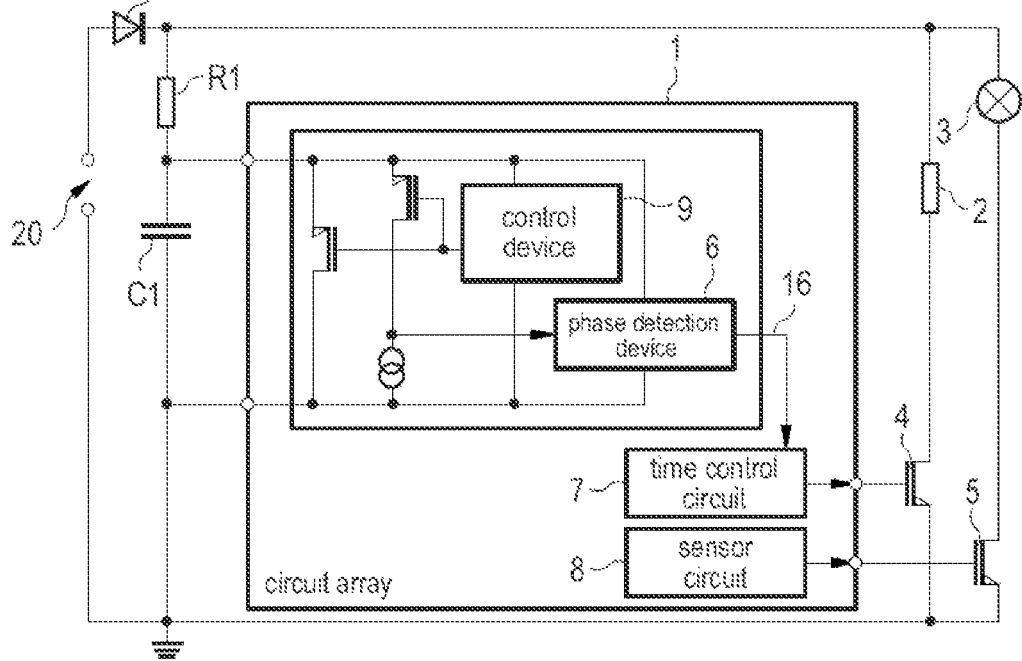
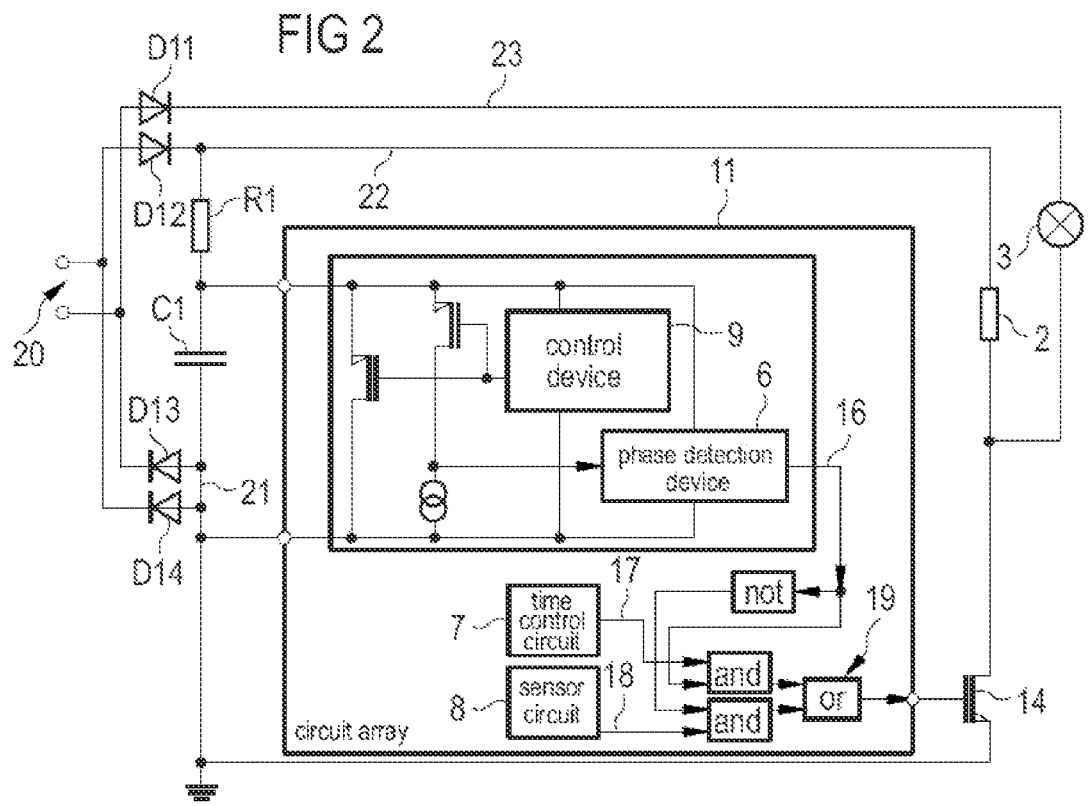

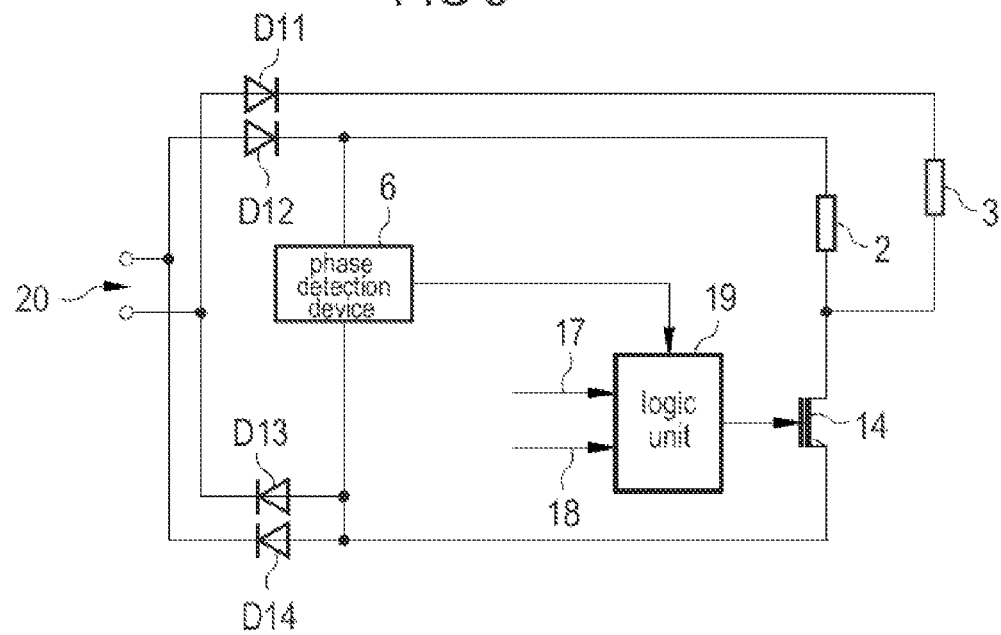
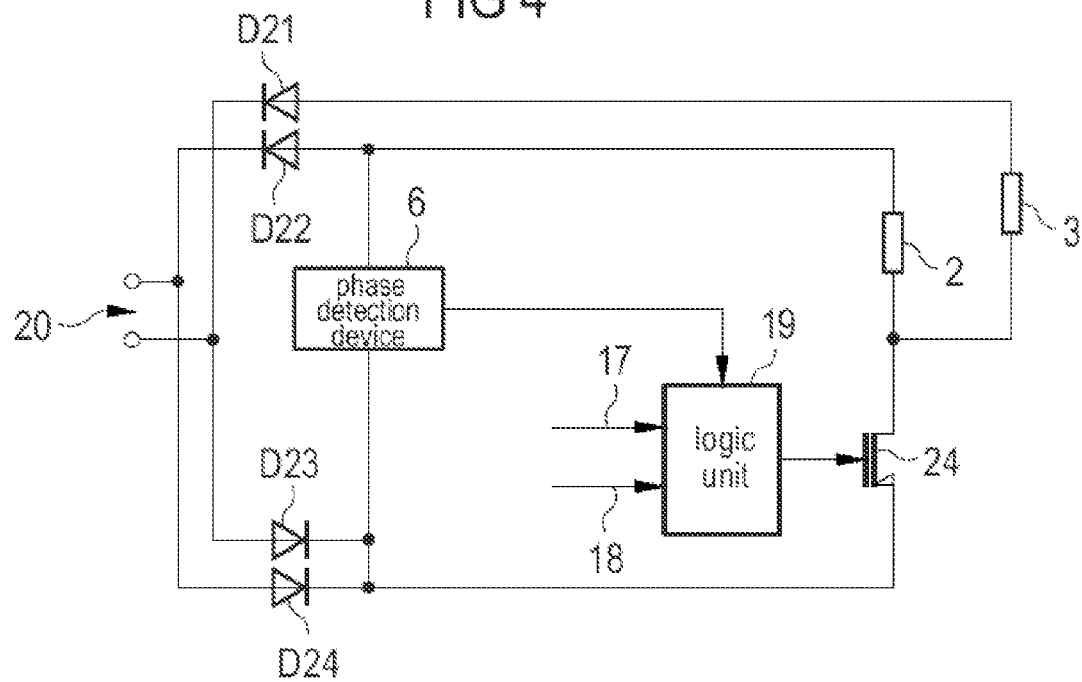

CIRCUIT ARRAY

TECHNICAL FIELD

The invention relates to a circuit array for controlling two independent loads operable with rectified AC voltage.

BACKGROUND

Many electric devices contain two loads that must separately controllable. An example of such a device is a humidifier that also includes a night-light. The humidifier is controlled by an automatic time switch, so that the applicable pumps and fans are always switched during a specific time period in which, for example, the operating noise is not disturbing. Other controls apply to the night-light. It is controlled as a factor of readings taken by a light sensor, for example, so that the night-light is only switched on when it is dark.

To solve this task, a circuit array for controlling two independent loads operable with rectified AC voltage is used in electric devices. Although electric loads, such as lamps, are also operable with AC voltage, it is advantageous, in terms of switching the loads, if the voltage in question is DC voltage. Said DC voltage can be switched with a MOSFET or a bipolar transistor, whereas the control of AC voltage-operated loads is significantly more complex, because both the positive and the negative half-wave must be taken into account. The controlled loads are generally operated with the standard power supply, because, on the one hand, a lower operating voltage would require a more expensive transformer and, on the other, the current that occurs would be considerably higher, which would require thicker cable diameters. Thus the entire circuit array, and therefore the device, would become more expensive. In the case of a 230-volt power supply, the peak voltage for rectified voltage is 340 volts. Therefore, the types of transistors used to switch loads must be capable of switching this high voltage. Thus, in the case of circuits based on the prior art, two semiconductor switches suitable for high voltage must be used, which are very expensive in comparison to the operating circuit and thus constitute a high proportion of total manufacturing costs. For this reason, the high price for the high voltage semiconductor switches used also constitutes a high proportion of the costs of the entire device, because electric devices of the type described are simply designed devices that are sold at very low prices.

A circuit essentially known in the art is shown in FIG. 1, and will be described in greater detail in connection with the description of the figures.

Because the semiconductor switches suitable for high voltage constitute a high proportion of total manufacturing costs, it is desirable not to be forced to use two semiconductor switches for the control of two loads.

SUMMARY

It is, therefore, the goal of the invention to provide a circuit array with which two loads can be connected independently of one another, without requiring the use of two semiconductor switches for switching the loads.

This goal is achieved, according to the invention, by means of a circuit array for controlling two independent loads, operable with rectified AC voltage, having a control unit for generating a control signal for a semiconductor switch, by means of which the two loads are each controllable as a factor of one control signal per load, wherein the control unit contains a phase detection device, by means of which a positive or negative phase of the AC voltage is detectable, and which furnishes an output signal describing the current phase, and wherein the control unit contains a logic unit for linking the control signals to the output signal of the phase detection device for determination of the control signal.

The underlying concept of the present invention consists in utilization of the fact that it is sufficient to supply a load with only a half-wave of the AC voltage applied to the input. Whereas the same half-wave is used for both loads in a circuit array of the prior art, the circuit array according to the invention provides for the use of a different half-wave for each load. As a result, an electric device can be advantageously designed in such a way that only one semiconductor switch is needed.

For this reason, the circuit array according to the invention is used in an electric device in conjunction with a rectifier, which is executed in an open bridge circuit. While one rectifier output is jointly used, each of the two other rectifier outputs is designed for one load.

A circuit array according to the invention is advantageously designed in such a way that a time control is provided to generate at least one control signal, while a sensor circuit can be provided for the other control signal. The two control variants, that is, based on time or on a sensor reading, can also be combined.

In the following, the invention will be explained in greater detail, using exemplary embodiments.

DESCRIPTION OF THE DRAWINGS

FIG. 1 shows a circuit array, in accordance with the prior art, in an electric device;

FIG. 2 shows a circuit array in accordance with the invention; and

FIGS. 3 and 4 show two variants for realization of a circuit array in accordance with the invention.

DETAILED DESCRIPTION

FIG. 1 shows a circuit array 1 for controlling two independent loads operable with rectified AC voltage, as it is known in the prior art. In this connection, a rectifier diode D1 is connected to an AC voltage input 20. The half-waves admitted by the diode D1 are available as a power supply for the circuit array 1, on the one hand, as well as to the loads 2 and 3. A heating resistor 2 and a lamp 3, for example, are provided as loads 2 and 3. The second lead of the AC voltage input 20 is connected to ground. The load current circuits are closed by two semiconductor switches 4 and 5, which connect the respective loads 2 and 3 to ground. In this example, a circuit array based on the N-channel MOSFETs of the prior art is provided as semiconductor switch.

To equalize the voltage rectified in a very simple manner by the half-wave rectifier D1, a resistor R1 and a capacitor C1 are provided, which are used to supply power to the circuit array 1. The circuit array 1 contains a control device 9 and a phase detection device 6. The phase detection device 6 detects, based on the ripple of the input voltage, whether the diode D1 is admitting a positive half-wave or whether a negative half-wave is being applied. The phase detection device 6 provides, at its output, an output signal 16, which simultaneously triggers a time control 7 and a sensor circuit 8. Said time control and sensor circuit then control the two semiconductor switches 4 and 5. Thus, if the sensor circuit 8 determines, for example, that the lamp 3 ought to be switched on, it activates the semiconductor switch 5 when the output signal 16 of the phase detection device 6 is applied, so that said semiconductor switch becomes low-impedance and the current circuit containing the lamp 3 is closed.

In the same manner, the time control 7 activates the semiconductor switch, so that said switch closes the current circuit containing the heating resistor 2.

FIG. 2 shows a circuit, according to the invention, for controlling two independent loads 2 and 3 operable with rectified AC voltage. The segment of the circuit array that contains the control unit 9 and the phase detection device 6 is similar to that shown in FIG. 1. At the output of the phase detection device 6, an output signal 16 is issued, on the basis of which it is detectable whether the positive phase of the AC voltage is currently being applied. A time control 7 generates a control signal 17, which indicates whether the heating resistor 2 should be switched on. A sensor circuit 8 generates a control signal, which indicates whether the lamp 3 should be switched on. According to the invention, these control signals are linked to the output signal 16 of the phase detection device 6. In this arrangement, each control signal 17 and 18 is linked to the output signal 16, wherein the control signal 18 is linked to the inverted output signal 16 in an AND element, while the control signal 16 is directly supplied to the AND element provided for linkage with the control signal 17. The outputs of the two AND elements are connected to one another in an OR link, and the outcome of the linkage is made available to control a semiconductor switch 14.

In the present case, it is assumed that the presence of a positive half-wave is signaled with a logical "1", and that the semiconductor switch 4, in the present exemplary embodiment an N-channel MOSFET, is to be connected when the time control 7 also issues a "1". As a result of the inversion, the other AND element receives a logical "0" in the case of a positive half-wave. Thus, in the case of a positive half-wave, it is impossible to obtain a "1" at the output of the AND element connected to the sensor unit 8, even when the control signal 18 signals a logical "1". The relationships are reversed in the case of a negative half-wave.

In other words, the logic unit 19 consisting of the logic elements described above causes the time control 7 default value to be taken into account during the positive half-wave, while the sensor circuit 8 default value is taken into account during the negative half-wave.

To ensure that the switched state of the MOSFET 4 only affects one of the two loads 2 and 3, a rectifier is executed in an open bridge circuit. The rectifier formed by the diodes D11 to D14 is switched in such a way that the negative half-waves are admitted to a shared DC voltage output 21. The negative DC voltage output 21 is connected to ground. The positive DC voltage output 22 and 23 is split in half, that is, the cathodes of diodes D11 and D12 are not connected to one another. Instead, the cathode of diode D11 is connected to the load 3, that is, the lamp, while the cathode of diode D12 is connected to the heating resistor 2.

The voltage tap for the circuit array 11 and therefore for the phase detection device 6 is at the cathode of diode D12; in other words, the phase at the DC voltage output 22 is used for detection. As a result, the detection of a positive half-wave signifies that a current only flows through the heating resistor 2 during this half-wave. Thus, the control signal of the time circuit 7, which can only be taken into account during a positive semiconductor, as described above, only affects the heating resistor 2, because current cannot flow through the lamp 3. The situation is reversed in the case of a negative half-wave, which means that the sensor circuit 8 can only affect the switched state of the lamp 3.

Thus, an electric device, which requires only one MOSFET 14 to control two independent loads, can be executed with the circuit array according to the invention. Of course, a bipolar transistor can also be used in place of a MOSFET 14, in which case only the control circuit for controlling the transistor 14, which is not shown in detail, changes.

The principle of the circuit shown in FIG. 2 is shown again in FIG. 3 in a simple, schematic depiction, wherein an N-channel MOSFET is again used as a semiconductor switch 14. In FIG. 4, a P-channel MOSFET 24 is used in place of an N-channel MOSFET 14. As an additional modification, the diodes must be connected in reversed polarity. Compared with the circuit shown in FIG. 3, the polarity of diode 21 is the reverse of that of diode D11. The same applies to the other diodes, D22, D23 and D24.

The invention is not limited to the version of the logic unit 19 shown in FIG. 2. Instead, many variations of this circuit are also conceivable. In FIGS. 3 and 4, the logic unit 19 is shown as a schematic multiplexer circuit, so that this functionality of the invention also encompasses all circuits.

The invention claimed is:

1. A circuit array for controlling operation of two loads that operate with a rectified AC voltage, the circuit array comprising:
   a first current path that includes a first load of the two loads;
   a second current path that includes a second load of the two loads;
   a semiconductor switch on a circuit path that includes the two loads, the semiconductor switch being electrically connected to a common node of the first current path and the second current path; and
   a control unit to generate a switch control signal that controls the semiconductor switch; wherein the control unit comprises:
   a phase detection device to detect whether a phase of the AC voltage is positive or negative, and to output a logical detection signal that is based on whether the phase is positive or negative; and
   a logic unit to generate the switch control signal based on one or more logical load control signals and the logical detection signal, wherein the control unit is configured to supply the first current path with a first half wave of the rectified AC voltage and to supply the second current path with a second half wave of the rectified AC voltage.

2. The circuit array of claim 1, wherein the control unit further comprises a time control circuit for generating one of the load control signals, the time control circuit generating the one of the load control signals at a predetermined time.

3. The circuit array of claim 1, wherein the control unit further comprises a sensor circuit for generating one of the load control signals, the sensor circuit generating the one of the load control signals in response to a sensed condition.

4. The circuit array of claim 1, wherein the logic unit is comprises a multiplexer that receives the load control signals and that outputs the switch control signal in response to the detection signal.

5. The circuit array of claim 1, wherein the circuit array is part of an integrated circuit.

6. The circuit array of claim 1, wherein the semiconductor switch on the circuit path that includes the two loads comprises a single MOSFET device.

7. The circuit array of claim 1, wherein the circuit array for controlling a switch to apply voltage to the two loads is configured to:
   apply a voltage to the first load of the two loads when a phase of the AC voltage is positive and
   apply a voltage to the second load of the two loads when a phase of the AC voltage is negative.

8. The circuit array of claim 1, wherein the semiconductor switch is connected between ground and the two loads.

9. The circuit array of claim 1 wherein the logical load control signal comprises a signal selected from a group consisting of a logical 0 and a logical 1.

10. An electronic device, comprising:
an input having leads to receive AC voltage;
a circuit array for controlling a switch to apply voltage to first and second loads based on whether a phase of the AC voltage is positive or negative and logical load control signals generated separately for the first and second loads; and
a rectifier that is connected to the input and that provides the voltage to the first and second loads, the voltage being generated from the AC voltage, wherein the rectifier comprises an open bridge circuit, and wherein the voltage comprises different half waves of the AC voltage wherein a first half wave of the rectified AC voltage is applied to the first load and a second half wave of the rectified AC voltage is applied to the second load.

11. The electronic device of claim 10, wherein the circuit array comprises:
a phase detection device to detect whether a phase of the AC voltage is positive or negative and to output a logical detection signal that corresponds to the phase; and
a logic unit to generate, based on the logical load control signals and the logical detection signal, a switch control signal to control the switch.

12. The electronic device of claim 11, wherein the logic unit comprises a multiplexer that receives the load control signals and that outputs the switch control signal in response to the detection signal.

13. The electronic device of claim 10, wherein the control unit comprises a time control circuit for generating one of the load control signals, the time control circuit generating the one of the load control signals at a predetermined time.

14. The electronic device of claim 10, wherein the control unit comprises a sensor circuit for generating one of the load control signals, the sensor circuit generating the one of the load control signals in response to a sensed condition.

15. The electronic device of claim 10, wherein the circuit array is part of an integrated circuit.

* * * * *

UNITED STATES PATENT AND TRADEMARK OFFICE
CERTIFICATE OF CORRECTION

| | | |
|---|---|---|
| PATENT NO. | : 8,212,391 B2 | Page 1 of 1 |
| APPLICATION NO. | : 10/521931 | |
| DATED | : July 3, 2012 | |
| INVENTOR(S) | : Helmut Theiler | |

It is certified that error appears in the above-identified patent and that said Letters Patent is hereby corrected as shown below:

Column 4, Line 51 (Approx.), In Claim 4, after "unit" delete "is"

Signed and Sealed this
Twenty-eighth Day of August, 2012

David J. Kappos
*Director of the United States Patent and Trademark Office*